(12) United States Patent
Kawaguchi et al.

(10) Patent No.: US 7,728,516 B2
(45) Date of Patent: Jun. 1, 2010

(54) ORGANIC EL DISPLAY

(75) Inventors: Koji Kawaguchi, Nagano (JP); Kenya Sakurai, Nagano (JP)

(73) Assignee: Fuji Electric Holdings Co., Ltd., Kawasaki (JP)

( * ) Notice: Subject to any disclaimer, the term of this patent is extended or adjusted under 35 U.S.C. 154(b) by 534 days.

(21) Appl. No.: 10/520,006

(22) PCT Filed: Jun. 13, 2003

(86) PCT No.: PCT/JP03/07563
§ 371 (c)(1),
(2), (4) Date: Feb. 16, 2006

(87) PCT Pub. No.: WO2004/112438
PCT Pub. Date: Dec. 23, 2004

(65) Prior Publication Data
US 2006/0202613 A1    Sep. 14, 2006

(51) Int. Cl.
*H01J 1/62* (2006.01)
*H01J 63/04* (2006.01)
(52) U.S. Cl. .................. 313/506; 313/504; 313/509; 313/512; 313/498
(58) Field of Classification Search ............... 313/504, 313/506
See application file for complete search history.

(56) References Cited

U.S. PATENT DOCUMENTS

| | | | | |
|---|---|---|---|---|
| 5,909,081 | A * | 6/1999 | Eida et al. | 313/504 |
| 6,611,108 | B2 * | 8/2003 | Kimura | 315/169.3 |
| 6,815,723 | B2 * | 11/2004 | Yamazaki et al. | 257/88 |
| 6,967,435 | B2 * | 11/2005 | Park et al. | 313/501 |
| 2001/0031379 | A1 | 10/2001 | Tera et al. | |
| 2001/0038367 | A1 * | 11/2001 | Inukai | 345/76 |

FOREIGN PATENT DOCUMENTS

| | | |
|---|---|---|
| JP | 05-094878 | 4/1993 |
| JP | 10-106746 | 4/1998 |
| JP | 10-106746 A | 4/1998 |
| JP | 11-067451 | 3/1999 |
| JP | 11-121167 | 4/1999 |
| JP | 11-297477 | 10/1999 |
| JP | 2000-223261 | 8/2000 |
| JP | 2000-223261 | 11/2000 |

(Continued)

*Primary Examiner*—Nimeshkumar D. Patel
*Assistant Examiner*—Thomas A Hollweg
(74) *Attorney, Agent, or Firm*—Rabin & Berdo, P.C.

(57) ABSTRACT

An organic EL display is constituted by providing a stress-relieving layer made of a material having a higher elastisity and a lower refractive index than an adhesive layer at edges of color-converting filters that are constituted from color filter layers alone, or color filter layers and color-converting layers, and are formed on a transparent supporting substrate. As a result, stress arising when bonding the color-converting filters and the organic light-emitting device together, or when there are changes in the environment in which the display is placed is absorbed by the stress-relieving layer, and hence the light-emitting device is not damaged, and moreover reflection at walls of the stress-relieving layer is promoted, and hence there is a reduction in the component of the light emitted by the light-emitting device that escapes sideways. An organic EL display having high reliability and high efficiency is thus provided.

3 Claims, 3 Drawing Sheets

FOREIGN PATENT DOCUMENTS

| | | |
|---|---|---|
| JP | 2001-217072 | 8/2001 |
| JP | 2001-217072 | 10/2001 |
| JP | 2001-284042 | 10/2001 |
| JP | 2001-338754 | 12/2001 |
| JP | 2001338754 A | 12/2001 |
| JP | 2002-164180 | 6/2002 |
| JP | 2002-164180 A | 6/2002 |
| JP | 2003-036974 | 2/2003 |
| JP | 2003-036974 A | 2/2003 |
| WO | WO-02/11209 A2 | 2/2002 |
| WO | WO-03/101155 A1 | 12/2003 |

* cited by examiner

ORGANIC EL DISPLAY

CROSS-REFERENCE TO RELATED APPLICATIONS

This application incorporates by reference the entire disclosure and content of the corresponding PCT application PCT/JP2003/07563, filed on Jun. 13, 2003. Also incorporated by reference are the entire disclosure and contents of the corresponding earlier Japanese patent application JP PA 2002-084434.

TECHNICAL FIELD

The invention relates to an organic EL (electroluminescent) display and can be used in a wide range of applications such as a display of mobile terminal equipment or industrial measuring equipment.

REVIEW OF RELATED TECHNOLOGY

In recent years, color organic EL (electroluminescent) displays with a driving method using thin film transistors (TFTs) have been devised. With a method in which the light is extracted from the side of the substrate on which the TFTs are formed, due to the effect of wiring parts blocking the light, the aperture ratio cannot be raised; recently, a so-called top emission method, in which the light is extracted from the side OF the substrate opposite to that on which the TFTs are formed, has been devised.

On the other hand, a color conversion method in which patterned fluorescent bodies are made to absorb light emitted from an organic EL device and hence fluorescence of a plurality of colors is emitted from the fluorescent bodies has been proposed, and is being developed. With this method, by adopting the top emission method using TFT driving, there is the possibility of being able to provide an organic EL display having yet higher detail and higher brightness. The color displays disclosed in Japanese Patent Application Laid-open No. 11-251059 and Japanese Patent Application Laid-open No. 2000-77191 are examples of such a system.

With such a top emission method using TFT driving, there are problems as follows.

Problem of Stress

As a structure of a top emission display using the color conversion method, there has been disclosed a structure in which color-converting filters are disposed facing an upper transparent electrode on an organic light-emitting device with a fixed gap provided therebetween by a columnar gap-adjusting layer disposed therebetween (see Japanese Patent Application Laid-open No. 11-297477). Moreover, one can also envisage a method in which this gap is filled with an oily substance.

However, with the constitution in which a fixed gap is provided, the efficiency of extracting light from the organic light-emitting device is worsened due to there being an air layer having a different refractive index between the organic light-emitting layer and the color-converting layers. Moreover, by filling the gap with an oil, this problem is alleviated, but the display manufacturing process becomes more complicated, and moreover the shock resistance, which is an intrinsic advantage of an organic EL display that is a completely solid device, is marred, and hence this method cannot be said to be the best.

There is a method of resolving these problems in which an organic light-emitting device, and color-converting filters that face an upper transparent electrode on the organic light-emitting device are bonded together via an adhesive layer; however, with this structure, there is a problem of the light-emitting device being damaged by stress arising, for example, through changes in the temperature of the environment in which the manufactured display is placed, or during the step of bonding the organic light-emitting device and the color-converting filters together.

Problem of Efficiency of Extracting Light

One approach for increasing the efficiency of a display is to improve the efficiency of extracting light to the outside. With the top emission display structure using the color conversion method, one factor in the efficiency of extracting light to the outside dropping is loss in the adhesive layer. This is due to a component of the light that escapes sideways in the adhesive layer in the case that the direction of extracting the light is made to be upward.

SUMMARY OF THE INVENTION

To resolve the above problems, the invention provides an organic EL display as follows.

An organic EL display includes an organic light-emitting device, which is constituted by forming on top of one another a substrate, thin film transistors that each have a source and a drain, anodes or cathodes that are made of an electrically conductive thin film material and are each connected to the source or the drain on a corresponding one of the thin film transistors, an organic EL light-emitting layer, an upper transparent electrode that is a cathode or anode made of a transparent electrically conductive material, and at least one passivation layer on the upper transparent electrode, and which is driven by the thin film transistors. The display also includes a color-converting substrate that includes a transparent supporting substrate, and color-converting filters that are constituted from color filter layers alone, or color filter layers and color-converting layers, and are formed on the supporting substrate. An adhesive layer is provided between the organic light-emitting device and the color-converting filters, and bonds the organic light-emitting device and the color-converting filters together with the color-converting filters facing the upper transparent electrode of the organic light-emitting device. A stress-relieving layer is provided between the organic light-emitting device and the color-converting filters, and is disposed at edges of the color-converting filters.

Moreover, in the organic EL display, the stress-relieving layer includes one containing a resin having a higher elasticity than the adhesive layer, one having a lower refractive index than the adhesive layer, one having a reverse tapered shape relative to the color filter layers alone, or the color filter layers and the color-converting layers, of the color-converting filters, one that is black, one that is a good thermal conductor, and one that is formed from a polymeric material having a good thermal conductor dispersed therein.

DETAILED DESCRIPTION OF THE PREFERRED EMBODIMENTS

Following is a description of embodiments of an organic EL (electroluminescent) display of the invention.

Figure 1:
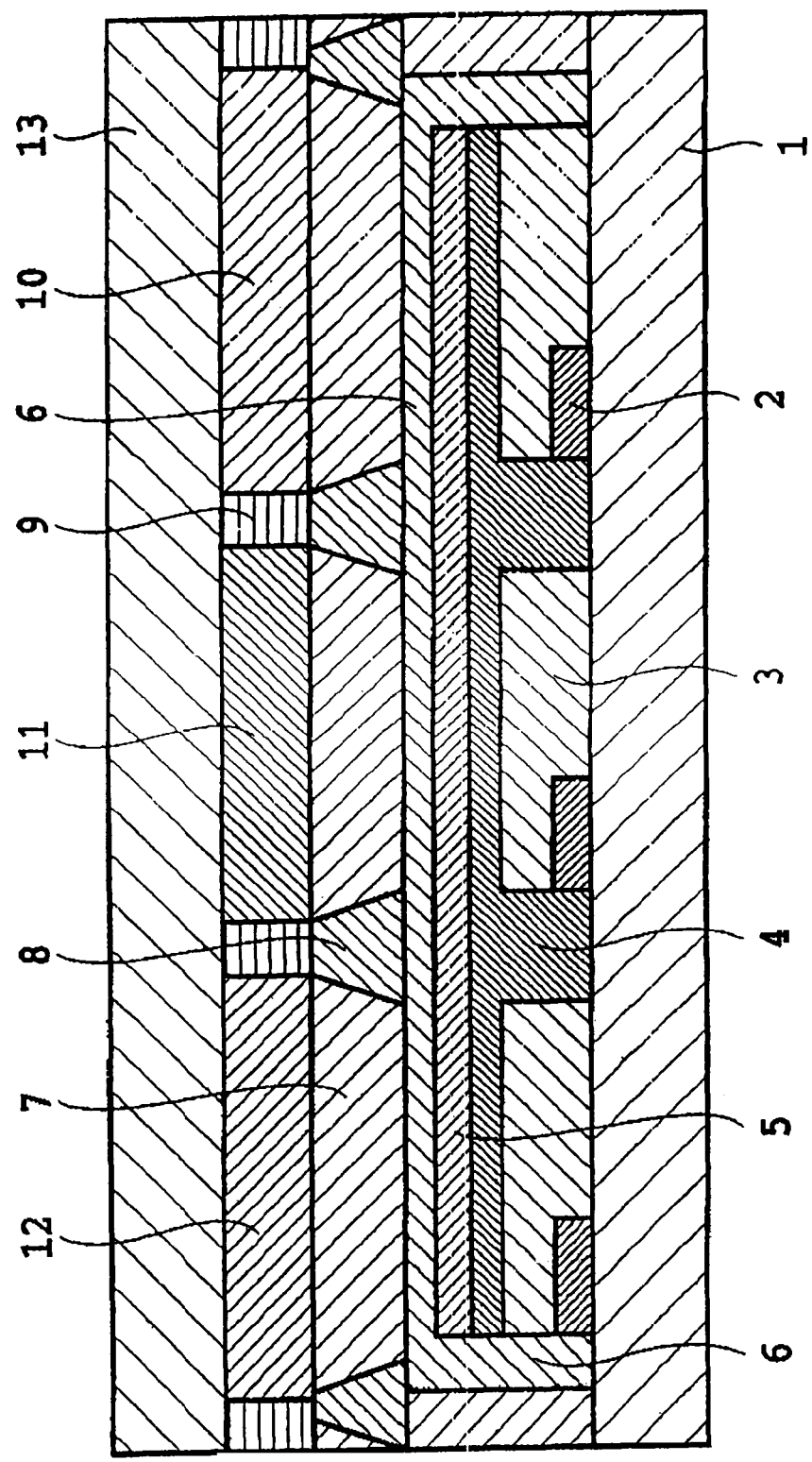
FIG. 1 is a schematic sectional view showing the constitution of an organic EL display of the invention.

FIG. 1 is a schematic sectional view of an organic EL display showing an embodiment of the invention.

In the following description, description is given for the case that lower electrodes are anodes, but it is also possible to make the lower electrodes be cathodes, in which case the film structure is the exact opposite from top to bottom.

1: Thin Film Transistor (TFT) Substrate and Anodes

TFTs are arranged in a matrix on an insulating substrate made of glass, plastic or the like, or a substrate obtained by forming an insulating thin film on a semiconductive or conductive substrate, and source electrodes are connected to the anodes in correspondence with the pixels.

The TFTs are of a bottom gate type in which a gate electrode is provided below a gate insulating film, and have a structure in which a polycrystalline silicon film is used as an active layer.

The anodes are formed on a flattening insulating film formed on the TFTs. With an ordinary organic EL device, ITO, which is transparent and has a high work function, is used as the anode material, but in the case of top emission, an electrode of a metal having high reflectivity (Al, Ag, Mo, W or the like) is used below the ITO.

2: Organic EL Device

For the organic light-emitting device, one having a layer structure such as the following is adopted.

(1) Anodes, organic EL light-emitting layer, cathode (2) Anodes, hole injection layer, organic EL light-emitting layer, cathode (3) Anodes, organic EL light-emitting layer, electron injection layer, cathode (4) Anodes, hole injection layer, organic EL light-emitting layer, electron injection layer, cathode (5) Anodes, hole injection layer, hole transport layer, organic EL light-emitting layer, electron injection layer, cathode With the top emission color conversion method of the present embodiment, in the above layer structures, the cathode must be transparent in the wavelength region of the light emitted by the organic EL light-emitting layer, the light being emitted via this transparent cathode.

The transparent cathode is made to have a constitution in which an ultra-thin film (not more than 10 nm) of an electron-injecting metal selected from alkali metals such as potassium, lithium, and sodium, alkaline earth metals such as calcium, magnesium and strontium, and fluorides and so on thereof, or an alloy thereof with other metals or a compound thereof is used as an electron injection layer, and a transparent electrically conductive film of ITO, IZO or the like is formed thereon.

Publicly-known materials are used as the materials of the various layers of the organic light-emitting layer. For example, to obtain luminescence from blue to blue/green in color, for example a fluorescent whitening agent of benzothiazole type, benzimidazole type, benzoxazole type or the like, a metal chelated oxonium compound, a styrylbenzene type compound, an aromatic dimethylidene type compound, or the like is preferably used as the organic EL light-emitting layer.

3: Passivation Layer

For a passivation layer, a material that is electrically insulating, acts as a barrier against moisture and low-molecular-weight components, has high transparency in the visible region (a transmissivity of at least 50% in a range of 400 to 700 nm), and preferably has a film hardness of at least 2H is used.

For example, an inorganic oxide or inorganic nitride such as $SiO_x$, $SiN_x$, $SiN_xO_y$, $AlO_x$, $TiO_x$, $TaO_x$ or $ZnO_x$, or the like can be used. There are no particular limitations on the method of forming the passivation layer, with it being possible to form the passivation layer using a commonly used method such as sputtering, CVD, vacuum deposition, or dipping.

The passivation layer may be a single layer, but the effects will be greater with a passivation layer comprising a plurality of layers formed on top of one another.

The thickness of such a multi-layered passivation layer is preferably 0.3 to 5 μm.

4. Stress-Relieving Layer

The stress-relieving layer may be formed on an upper surface of the color-converting filters, or may be formed on the organic light-emitting device side; however, the organic light-emitting device is constituted from materials that are susceptible to heat and ultraviolet radiation, and hence there will be various constraints in the case of forming the stress-relieving layer on the organic light-emitting device. It is thus more preferable to form the stress-relieving layer on the color-converting filters, for which heat and ultraviolet radiation can be used more easily.

The stress-relieving layer is preferably one that can be formed at edges of the color-converting filters without marring the functions of the color-converting filters, and has higher elasticity than the adhesive layer; examples are polymeric materials that do not contain rigid groups in the unit structure thereof such as polyamide resins such as nylon 6 or nylon 6-6, silicone rubbers, any of various synthetic rubbers, and so on. Specifically, a material having a Young's modulus of not more than $0.3 \times 10^{10}$ Pa is preferable, more preferably not more than $0.1 \times 10^{10}$ Pa.

A photoresist can also be used if the photoresist contains a straight chain oligomer not containing rigid groups or a monomer having not more than three functional groups as a raw material thereof, and the three-dimensional crosslink density of the cured material is not very high. By using a photoresist, it becomes easy to form the reverse tapered shape.

Alternatively, a photoresist other than this can be used as the stress-relieving layer by being used in a state in which the crosslink density has been made to not become very high through weakening the irradiation with light or the amount of heating.

Regarding the refractive index of the material used in the stress-relieving layer, by using a material having a lower refractive index than that of the adhesive layer, the amount of light emitted from the device that does not contribute to the brightness of the display due to escaping to the stress-relieving layer side can be reduced. The greater the difference in refractive index to the adhesive, the more preferable, since then light incident at a lower angle can be reflected.

To improve the contrast, as a method of coloring the stress-relieving layer, for example a substance that absorbs visible light may be added into the material of the stress-relieving layer. The stress-relieving layer may be formed from a single material, or may be formed from a plurality of materials; for example, one can envisage a method of formation in which an elastic relieving layer is formed from a material for which the reverse tapered shape is easily obtained, and then the surface thereof is coated with a material having a low refractive index.

5. Adhesive Layer

The material of the adhesive layer for bonding together the color-converting filters and the organic light-emitting device is preferably a material that transmits visible light, and enables formation of the adhesive layer without the color-converting layers or the organic light-emitting device being damaged. For example, an ordinary thermoplastic resin, a thermosetting resin that can be cured by heating between normal temperature and 120° C., a resin that is cured by visible light or joint use of heat and light, or the like can be used.

6. Color-Converting Filters

1) Color-Converting Layers

In the invention, as organic fluorescent colorants, examples of fluorescent colorants that absorb light from the blue to blue/green region emitted from the light emitter and emit fluorescence in the red region are rhodamine type colorants such as Rhodamine B, Rhodamine 6G, Rhodamine 3B, Rhodamine 101, Rhodamine 110, sulforhodamines, Basic Violet 11 and Basic Red 2, cyanine type colorants, pyridine type colorants such as 1-ethyl-2-[4-(p-dimethylaminophenyl)-1,3-butadienyl]pyridinium perchlorate (Pyridine 1), oxazine type colorants, and so on. Furthermore, various dyes (direct dyes, acid dyes, basic dyes, disperse dyes, etc.) can also be used if fluorescent.

Examples of fluorescent colorants that absorb light from the blue to blue/green region emitted from the light emitter and emit fluorescence in the green region are coumarin type colorants such as 3-(2'-benzothiazolyl)-7-diethylaminocoumarin (Coumarin 6), 3-(2'-benzoimidazolyl)-7-N,N-diethylaminocoumarin (Coumarin 7), 3-(2'-N-methylbenzoimidazolyl)-7-N,N-diethylaminocoumarin (Coumarin 30) and 2,3,5,6-1H,4H-tetrahydro-8-trifluoromethylquinolizino-(9,9a,1-gh)coumarin (Coumarin 153), and Basic Yellow 51, which is a coumarin colorant type dye, and also naphthalimide type colorants such as Solvent Yellow 11 and Solvent Yellow 116, and so on. Furthermore, various dyes (direct dyes, acid dyes, basic dyes, disperse dyes, etc.) can also be used if fluorescent.

2) Matrix Resin

Next, a matrix resin used in the fluorescent color-converting films in the invention is a light-curable or joint-light/heat-curable resin that is made insoluble and unmeltable by carrying out light and/or heat treatment, thus generating radical species or ionic species and hence polymerizing or crosslinking the resin.

3) Color Filter Layers

In the case that sufficient color purity cannot be obtained with only the color-converting layers, the color-converting filters are made to be laminates of color filter layers and the color-converting layers.

The color filter layers preferably have a thickness of 1 to 1.5 μm.

Next, examples of the invention will be described together with a comparative example, with reference to the drawings.

Example 1

Figure 2:
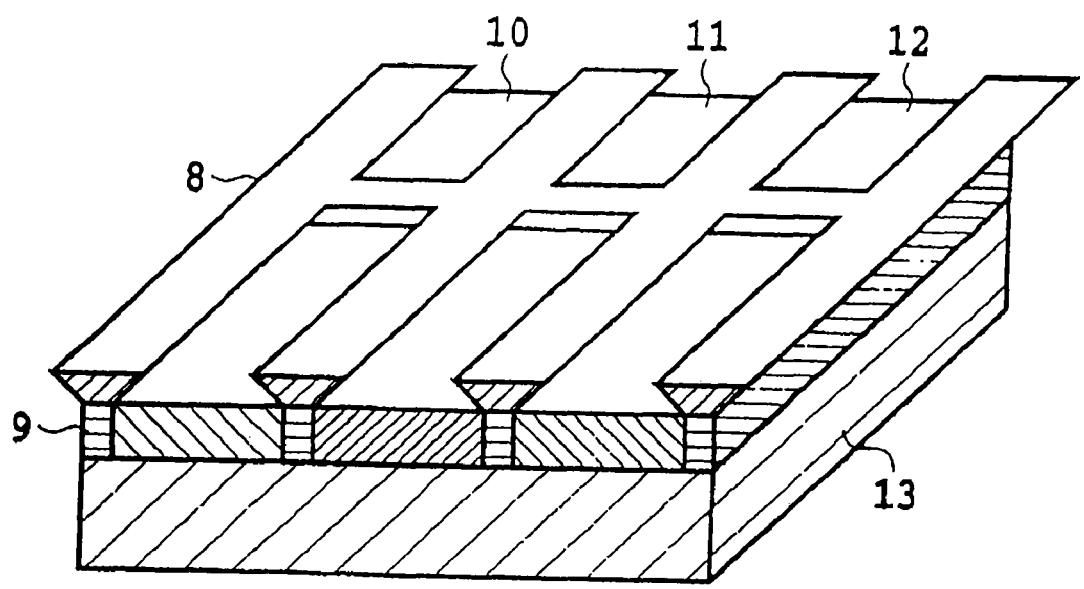
FIG. 2 is a schematic view showing an example of the layout of a stress-relieving layer of the invention.

FIG. 1 is a schematic sectional view of an organic EL display used in an example of the invention. FIG. 2 is a schematic view of a stress-relieving layer of the invention in the case of being provided on an upper surface of a color-converting substrate.

[TFT Substrate 1, TFTs 2, Anodes 3)]

As shown in FIG. 1, a constitution was adopted in which bottom gate type TFTs 2 were formed on a glass substrate 1, and the source of each TFT 2 was connected to an anode 3.

For each of the anodes 3, Al, which was connected to the source of the corresponding TFT via a contact hole formed in an insulating film on the TFT, not shown, was formed as a lower part, and IZO (InZnO) was formed on the upper surface thereof.

The Al is provided to reflect light emitted from a light-emitting layer so that light is discharged efficiently from the top, and to reduce the electrical resistance. The thickness of the Al film was made to be 300 nm. The upper part IZO has a high work function, and hence is provided so that holes can be injected efficiently. The thickness of the IZO was made to be 200 nm.

Organic EL Layer 4

An organic EL layer 4 was constituted from the four layers of anodes 3/hole injection layer/hole transport layer/organic EL light-emitting layer/electron injection layer/cathode 5 excluding the electrodes.

The substrate 1 having the anodes 3 formed thereon was put into a resistive heating vapor deposition apparatus, and the hole injection layer, the hole transport layer, the organic EL light-emitting layer, and the electron injection layer were deposited in this order without releasing the vacuum. During the deposition, the pressure inside the vacuum chamber was reduced down to $1 \times 10^{-4}$ Pa. Copper phthalocyanine (CuPc) was formed to a thickness of 100 nm as the hole injection layer. 4,4'-bis[N-(1-naphthyl)-N-phenylamino]biphenyl (α-NPD) was formed to a thickness of 20 nm as the hole transport layer. 4,4'-bis(2,2'-diphenylvinyl)biphenyl (DPVBi) was formed to a thickness of 30 nm as the organic EL light-emitting layer. An aluminum chelate (Alq) was formed to a thickness of 20 nm as the electron injection layer.

After that, a transparent cathode 5 was formed using a metal mask without releasing the vacuum.

The transparent cathode 5 was formed by depositing metallic Mg/Ag, which has a low work function as required for injection of electrons, to a thickness of 2 nm using a codeposition method, and then depositing an IZO film thereon to a thickness of 200 nm using a sputtering method.

Passivation Layer 6

An $SiON_x$ film was deposited by sputtering to a thickness of 300 nm as a passivation layer 6.

Color Filter Layers 10

A blue filter material (made by Fuji Hunt Electronics Technology; Color Mosaic CB-7001) was applied using a spin coating method onto a glass substrate 13, and then patterning was carried out using a photolithography method, thus obtaining a line pattern with a thickness of 6 μm.

After that, a photoresist (JNPC-48 made by JSR) was similarly applied using a spin coating onto the glass substrate 13, and then patterning was carried out using a photolithography method, thus forming a line pattern with a thickness of 5.5 μm (not shown) on the blue filter pattern, whereby color filter layers 10 of thickness 11.5 μm comprising a laminate of the blue filter pattern and a transparent resist pattern were obtained.

Color-Converting Layers 11 and 12

Red and green color filter layers (not shown) made of similar color filter materials to the blue filter material were applied using a spin coating method onto the substrate 13, and then patterning was carried out using a photolithography method, thus obtaining line patterns of green color filters and red color filters with a thickness of 1.5 µm.

Next, Coumarin 6 (0.7 parts by weight) as a green fluorescent colorant was dissolved in 120 parts by weight of a propylene glycol monoethyl acetate (PGMEA) solvent. 100 parts by weight of a photopolymerizable resin 'V259PA/P5' (trade name, Nippon Steel Chemical Co., Ltd.) was then added and dissolved, thus obtaining a coating liquid. This coating liquid was applied using a spin coating method onto the green color filters on the substrate 13, and then patterning was carried out using a photolithography method, thus obtaining a line pattern with a thickness of 10 µm, whereby green color-converting layers 11 of thickness 11.5 µm comprising a laminate of the green filter pattern and the green color-converting pattern were obtained.

Furthermore, Coumarin 6 (0.6 parts by weight), Rhodamine 6G (0.3 parts by weight) and Basic Violet 11 (0.3 parts by weight) as red fluorescent colorants were dissolved in 120 parts by weight of a propylene glycol monoethyl acetate (PGMEA) solvent. One hundred parts by weight of a photopolymerizable resin 'V259PA/P5' (trade name, Nippon Steel Chemical Co., Ltd.) was then added and dissolved, thus obtaining a coating liquid. This coating liquid was applied using a spin coating method onto the red color filters on the substrate 13, and then patterning was carried out using a photolithography method, thus obtaining a line pattern with a thickness of 10 µm, whereby red color-converting layers 12 of thickness 11.5 µm comprising a laminate of the red filter pattern and the red color-converting pattern were obtained.

A black mask 9 (thickness 11.5 µm) was formed between the color-converting layers of the various colors. As a black mask having high thermal conductivity, first 500 nm of chromium oxide was formed by sputtering using a mask enabling formation of a lattice pattern on walls of the color-converting layers. Next, using a similar mask, an SiN film was formed by sputtering around the red, green and blue sub-pixels so as to be the same thickness. The pitch of the pixels was 0.3×0.3 mm, and the shape of the sub-pixels of the various colors was 0.1×0.3 mm.

Stress-Relieving Layer 8

ZPN 1100 (made by Nippon Zeon Co., Ltd.) was applied using a spin coating method onto an upper surface of the color-converting layers, and then patterning was carried out using a photolithography method, thus forming a stress-relieving layer having a reverse tapered shape provided at edges of the color-converting layers. The thickness of the stress-relieving layer was 5 µm from the surface of the color-converting layers. Next, leaving only walls of the stress-relieving layer, an upper surface of the stress-relieving layer and upper surfaces of the color-converting layers were coated with an OFPR 8000 photoresist (made by Tokyo Ohka Kogyo Co., Ltd.). A Benefix VL visible light-curable resin (made by Ardel, refractive index 1.48) was further coated thereon, and then irradiation with visible light was carried out; the OFPR 8000 was then removed using a Stripping Solution 104 ("Stripping Solution 104" is the name of a product made by Tokyo Ohka Kogyo Co., Ltd.), whereby a stress-relieving layer 8 in which only the walls of the ZPN 1100 were coated with Benefix VL was formed.

Bonding Together

The organic light-emitting device and the color-converting substrate obtained as described above were bonded together using an adhesive. As the adhesive forming the adhesive layer 7, a polycarbonate curable by joint use of visible light and heat (made by Ardel, refractive index 1.56) was used.

Example 2

Manufacture was carried out as in Example 1, except that for the stress-relieving layer 8, ZPN 1100 having fine carbon particles (thermal conductivity 90 $Wm^{-1}K^{-1}$) dispersed therein was used, and modification of the walls with Benefix VL was not carried out. The mixing ratio of the resin and the carbon was 5:1 in terms of weight.

Comparative Example

Figure 3:
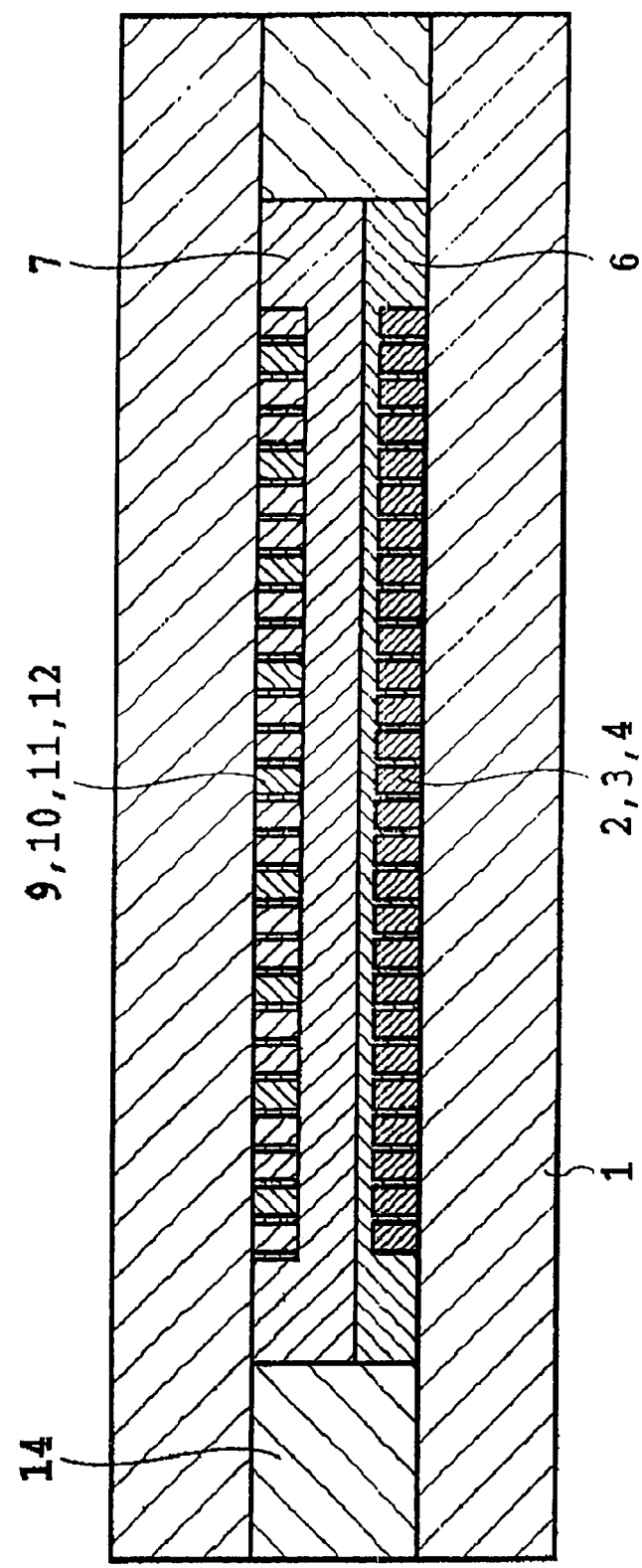
FIG. 3 is a schematic sectional view showing the constitution of a comparative example in the invention.

FIG. 3 is a schematic sectional view showing the constitution of a comparative example; members having the same function as members shown in FIG. 1 are given the same reference numerals as in FIG. 1, and detailed description thereof will be omitted here. In the comparative example of FIG. 3, a gap-adjusting frame structure 14 was formed around the periphery of a display part of the color-converting layers using a JNPC-48 negative type resist (made by JSR). Next, without a stress-relieving layer as shown in FIG. 1, the color-converting substrate side and the organic light-emitting device substrate side were bonded together with a polycarbonate forming an adhesive layer 7.

(Evaluation)

Evaluation was carried out for the following items. The results are shown in Table 1.

1. Heat Cycle Test:

Each manufactured display was subjected to a heat cycle test (−40° C.⇌95° C., 120 cycles, temperature raising/decreasing time less than 5 min), and it was observed whether or not abnormalities in the form arose.

2. Contrast

For the displays, a comparison was carried out of the contrast for the case of irradiating light from a fluorescent lamp (1000 1x) onto the display surface from an angle of 45° C.

3. Driving Lifetime

Each display was subjected to continuous driving using low-current passive driving with a constant current value, and a comparison was carried out of the driving time until the retention rate of the brightness relative to the initial brightness reached 50% due to the driving.

4. Efficiency

A comparison was carried out through the brightness in the case of driving each of the displays with a constant current value.

In Table 1, a result greater than 1.0 indicates a better result than for the comparative example; from the results of Table 1, it was found that the examples are superior to the comparative example.

TABLE 1

Summary of evaluation results

|  | Example 1 | Example | Comparative example |
|---|---|---|---|
| 1. Heat cycle | No change in form | No change in form | Peeling away of light-emitting device occurs |
| 2. Contrast* | 1.0 | 3.0 | 1.0 |
| 3. Driving lifetime* | 1.0 | 1.5 | 1.0 |
| 4. Efficiency* | 1.3 | 1.0 | 1.0 |

*For the contrast, the driving lifetime, and the efficiency, the value for the comparative example was taken as 1.0.

According to the invention, an organic EL display having high reliability and high efficiency can be provided.

Specifically, the organic EL display of the invention is made to have a constitution in which a stress-relieving layer made of a material having a higher elasticity than an adhesive layer is provided at edges of color-converting filters that are constituted from color filter layers alone, or color filter layers and color-converting layers, and are formed on a transparent supporting substrate; as a result, it can be made to be such that stress arising when bonding the color-converting filters and the organic light-emitting device together, or when there are changes in the environment in which the display is placed is absorbed by the stress-relieving layer, and hence the light-emitting device is not damaged.

Moreover, by making the refractive index of the stress-relieving layer be lower than that of the adhesive layer, reflection at walls of the stress-relieving layer is promoted, and hence the component of the light emitted by the light-emitting device that escapes sideways can be reduced.

Furthermore, by making the structure of the stress-relieving layer be a reverse tapered shape relative to the color-converting filters as shown in FIG. 1, the efficiency of extracting light is further improved.

Moreover, the component reflected at the walls of the stress-relieving layer may cause a drop in contrast. In the case that the contrast is considered to be more important than the efficiency of extracting light, the material of the stress-relieving layer is made to be a material that absorbs light, whereby the contrast of the panel is improved.

The invention claimed is:

1. An organic electroluminescent display, comprising:
(a) an organic light-emitting device including, in the recited sequence,
a substrate,
thin film transistors that each have a source and a drain,
anodes or cathodes that include an electrically conductive thin film material and are each connected to the source or the drain on a corresponding one of the thin film transistors,
an organic electroluminescent light-emitting layer,
an upper transparent electrode that is a cathode or anode and includes a transparent electrically conductive material, and
at least one passivation layer on the upper transparent electrode;
(b) a color-converting substrate that comprises
a transparent supporting substrate, and
color-converting filters that comprise color filter layers alone, or color filter layers and color-converting layers, and are disposed on the supporting substrate, the color-converting filters having edges;
(c) adhesive that is disposed between the organic light-emitting device and the color-converting filters, and that bonds the organic light-emitting device and the color-converting filters together with the color-converting filters facing the upper transparent electrode of the organic light-emitting device; and
(d) a stress-relieving layer that is disposed between the organic light-emitting device and the color-converting filters, the stress-relieving layer being patterned to have walls that are disposed in positions corresponding to the edges of the color-converting filters and to have openings between the walls, the adhesive extending into the openings,
wherein the stress-relieving layer is black.

2. An organic electroluminescent display, comprising:
(a) an organic light-emitting device including, in the recited sequence,
a substrate,
thin film transistors that each have a source and a drain,
anodes or cathodes that include an electrically conductive thin film material and are each connected to the source or the drain on a corresponding one of the thin film transistors,
an organic electroluminescent light-emitting layer,
an upper transparent electrode that is a cathode or anode and includes a transparent electrically conductive material, and
at least one passivation layer on the upper transparent electrode;
(b) a color-converting substrate that comprises
a transparent supporting substrate, and
color-converting filters that comprise color filter layers alone, or color filter layers and color-converting layers, and are disposed on the supporting substrate, the color-converting filters having edges;
(c) adhesive that is disposed between the organic light-emitting device and the color-converting filters, and that bonds the organic light-emitting device and the color-converting filters together with the color-converting filters facing the upper transparent electrode of the organic light-emitting device; and
(d) a stress-relieving layer that is disposed between the organic light-emitting device and the color-converting filters, the stress-relieving layer being patterned to have walls that are disposed in positions corresponding to the edges of the color-converting filters and to have openings between the walls, the adhesive extending into the openings,
wherein the stress-relieving layer has fine particles dispersed therein that promote thermal conductivity.

3. An organic electroluminescent display, comprising:
(a) an organic light-emitting device including, in the recited sequence,
a substrate,
thin film transistors that each have a source and a drain,
anodes or cathodes that include an electrically conductive thin film material and are each connected to the source or the drain on a corresponding one of the thin film transistors,
an organic electroluminescent light-emitting layer,
an upper transparent electrode that is a cathode or anode and includes a transparent electrically conductive material, and
at least one passivation layer on the upper transparent electrode;
(b) a color-converting substrate that comprises a transparent supporting substrate, and color-converting filters that comprise color filter layers alone, or color filter layers and color-converting layers, and are disposed on the supporting substrate, the color-converting filters having edges;

(c) adhesive that is disposed between and in direct contact with the organic light-emitting device and the color-converting filters, and that bonds the organic light-emitting device and the color-converting filters together with the color-converting filters facing the upper transparent electrode of the organic light-emitting device; and (d) a stress-relieving layer that is disposed between the organic light-emitting device and the color-converting filters, the stress-relieving layer being patterned to have walls that are disposed in positions corresponding to the edges of the color-converting filters and to have openings between the walls, the adhesive extending into the openings, the stress-relieving layer being formed from a polymeric material having fine carbon particles dispersed therein to promote thermal conductivity.

* * * * *